United States Patent [19]

Foo et al.

[11] Patent Number: 5,057,455
[45] Date of Patent: Oct. 15, 1991

[54] FORMATION OF INTEGRATED CIRCUIT ELECTRODES

[75] Inventors: Pang-Dow Foo, Berkeley Heights; William T. Lynch, Summit; Chien-Shing Pai, Bridgewater, all of N.J.

[73] Assignee: AT&T Bell Laboratories, Murray Hill, N.J.

[21] Appl. No.: 443,766

[22] Filed: Nov. 30, 1989

[51] Int. Cl.$^5$ .......................................... H01L 21/283
[52] U.S. Cl. ..................................... 437/193; 437/31; 437/57; 437/83; 437/90; 437/41
[58] Field of Search ................ 357/59, 34, 35; 437/83, 437/90, 93, 31, 32, 33, 191, 193, 34, 56, 57, 58, 41

[56] References Cited

U.S. PATENT DOCUMENTS

| | | | |
|---|---|---|---|
| 4,362,597 | 12/1982 | Fraser et al. | 156/643 |
| 4,400,867 | 8/1983 | Fraser | 437/200 |
| 4,419,809 | 12/1983 | Riseman et al. | 437/41 |
| 4,686,763 | 8/1987 | Thomas et al. | 437/51 |
| 4,808,555 | 2/1989 | Mauntel et al. | 437/191 |
| 4,824,796 | 4/1989 | Chiu et al. | 437/57 |

OTHER PUBLICATIONS

Ghandhi, S. K., *VLSI Fabrication Principles*, John Wiley & Sons, 1983, pp. 420-435, 492-495.
Pfiester, J. R., et al, "A Self-Aligned LDD/Channel . . . ." IEEE IEDM: Device Technology Subcommittee, 1989, 3 pages.

Primary Examiner—Brian E. Hearn
Assistant Examiner—T. N. Quach
Attorney, Agent, or Firm—D. I. Caplan

[57] ABSTRACT

In the fabrication of electrodes for transistors in the BiCMOS integrated circuit, vertical windows etched in a relatively thick TEOS (or other suitable dielectric) layer, located on a relatively thin polysilicon layer, in turn located on relatively tin oxide layer areas and on relatively thick oxide layer areas, are used to define areas where polysilicon electrode material is to remain. Polysilicon is deposited in the windows in the relatively thick insulating layer, to form the basis for the desired electrode in each window. The relatively thin polysilicon layer (or, alternatively an α-amorphous silicon layer) is thereafter used as an etch stop during the subsequent removal of the relatively thick dielectric layer. Thereafter both MOS and bipolar transistors can be fabricated using the windows to define the extents of the gate regions of the MOS transistors and the extents of the emitter regions of the bipolar transistors. In addition, both the source and drain electrodes of the MOS transistors and the base electrodes of the bipolar transistors can then be simultaneously formed in a self-aligned manner without the need for etching into the underlying semiconductor substrate in which the integrated circuit is being formed.

16 Claims, 4 Drawing Sheets

FORMATION OF INTEGRATED CIRCUIT ELECTRODES

TECHNICAL FIELD

This invention relates to semiconductor integrated circuits and more particularly to methods for fabricating electrodes for transistors and for other metallizations in such circuits.

BACKGROUND OF THE INVENTION

As known in the art, n-channel and p-channel MOS transistors can be connected together to form complementary MOS (CMOS) circuits, and these can be connected together with bipolar transistors to form BiCMOS circuits. In the art of the fabrication of these integrated circuits, the crucial linewidth feature is the uniformity of the source-drain lengths of the gate electrodes of the MOS (metal oxide semiconductor) transistors and of the widths of the emitter regions for the bipolar transistors, as well as the smoothness of the sidewalls of these electrodes.

In prior art, these electrodes are typically fabricated by (1) depositing a layer of the electrode material, (2) coating the layer of electrode material with a photoresist layer, (3) patterning the photoresist in accordance with the desired pattern of the transistor electrode, and (4) selectively etching the layer of electrode material using the remaining (patterned) layer of photoresist as an etch mask, whereby the electrode material remains only at areas located underneath the patterned photoresist. Hence the remaining electrode material can serve as the desired electrode for the bipolar or MOS transistor, as the case may be.

This (positive tone) method, however, suffers from a disadvantage that is especially undesirable in case the width (feature size) of the electrode is less than approximately 0.6 micrometer, namely, the disadvantage that the uniformity of the electrode widths from wafer to wafer or from batch of wafers to batch of wafers, or both, may not be good enough at such small feature sizes for commercially acceptable yields. By "wafer to wafer" uniformity is meant the uniformity of one semiconductor wafer relative to another wafer being simultaneously fabricated; by "batch to batch" uniformity is meant the uniformity of one group of semiconductor wafers being fabricated relative to another. More specifically, this nonuniformity arises from the fact that the sidewalls of the electrodes, as well as the lengths of the electrodes, as fabricated by the above-described positive tone method are not well controlled, since the etching of an electrode fluctuates with the parameters of its deposition and doping. Also a so-called "proximity effect" can occur. This effect arises from the fact that debris from each electrode being etched is deposited at the edges of neighboring electrodes, whereby the presence of each electrode can undesirably influence the dimensions of the neighboring electrodes in an irregular and uncontrolled manner. Moreover, photoresist layers with feature sizes below approximately 0.6 micrometer can have an unwantedtendency to distort (because of stress), to lift at the edges (undercut), or to peel off (lift off) prematurely, i.e., to peel off before serving their function as masks against etching the electrode material located underneath these photoresist layers, whereby the contours of the electrode edges are distorted.

Furthermore, in fabricating transistors of the bipolar type, self-aligned base contact structures are desirable. That is, it is desirable (in a vertical transistor path structure) that the emitter-base junction should automatically be laterally confined to within a relatively small distance from the lateral extent of the highly doped base contact. In U.S. Pat. No. 4,824,796, such a self-aligned base contact structure in a bipolar transistor was described, but fabrication of that structure required a step of etching into the silicon substrate in the base contact region. Such a step undesirably requires extremely careful control over the etching time, lest the base contact diffusion extend too deeply into the collector region, or require the structure to have an undesirably thicker base.

Therefore it would be desirable to have a method for fabricating both gate and emitter electrodes for MOS and bipolar transistors, respectively, preferably both at the same time on the same semiconductor body, for both n channel and p channel MOS (BiCMOS) transistors, which alleviates the foregoing problems.

SUMMARY OF THE INVENTION

The foregoing problems in the prior art can be alleviated in accordance with this inventinn by means of a method of fabricating semiconductor integrated circuits including the steps of:

(a) forming a first relatively thick and a relatively thin insulating layer upon respective first and second portions of a major surface of a semiconductor body;

(b) forming a first polycrystalline silicon or an amorphous silicon layer upon both the relatively thin and the first relatively thick insulating layer;

(c) forming a second relatively thick insulating layer upon the first polycrystalline or amorphous silicon layer;

(d) forming a vertical aperture penetrating at least through the second relatively thick insulating layer;

(e) depositing a vertical polysilicon layer within the vertical aperture contacting the first polycrystalline or amorphous silicon layer, and (f) removing the second relatively thick insulating layer.

For the purpose of fabricating the emitter electrode of a bipolar transistor which is being fabricated at the same time that MOS transistors are being fabricated elsewhere on the same semiconductor body, advantageously in the foregoing method the vertical aperture for the emitter electrode penetrates through the first polycrystalline or amorphous silicon layer and through the relatively thin insulating layer.

The method of this invention has been tested and found to yield satisfactory results.

BRIEF DESCRIPTION OF THE DRAWING

This invention, together with its features, characteristics, and advantages may be understood from the following detailed description when read in conjunction with the drawings in which.

Only for the sake of clarity, none of the drawings is to scale.

DETAILED DESCRIPTION

Figure 1:
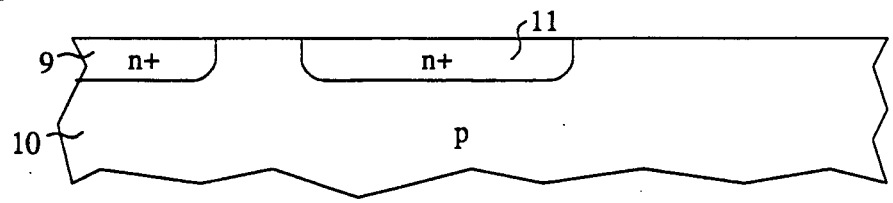
FIGS. 1-9 show various stages in the fabrication of a BiCMOS transistor integrated circuit arrangement on a semiconductor body, in accordance with a specific embodiment of the invention.
Figure 9:
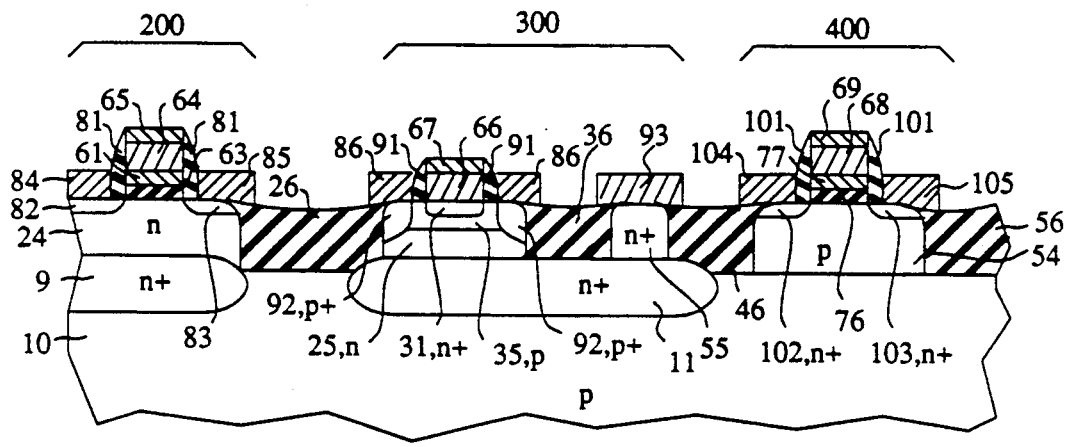

FIG. 1 shows an early stage of fabrication of the BiCMOS structure shown in FIG. 9, in accordance with a specific embodiment of the invention. FIG. 9 shows a bipolar npn transistor structure 300 located in the center thereof, a p-channel MOS transistor structure 200 located on the left-hand side thereof, and an n-channel MOS transistor 400 located on the right-hand side thereof.

As shown in FIG. 1, a silicon body (substrate) 10 of p type conductivity is prepared, as known in the art, with an acceptor impurity concentration of typically approximately 1.0E15 (i.e., $1.0 \times 10^{15}$) per cubic centimeter. The body has localized n+ type conductivity regions 9 and 11 situated at the top major surface of the body. These localized regions 9 and 11 can be formed by conventional masked doping with donor impurities, typically to a concentration of approximately 1.0E19 per cubic centimeter, typically by means of ion implantation and annealing.

Figure 2:
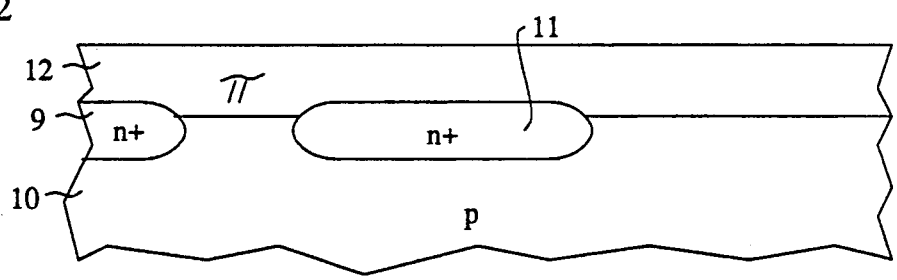

An epitaxial silicon layer 12 of $\pi$ type conductivity is then (FIG. 2) grown on the top surface of the body 10. Typically the concentration of acceptor impurities in this $\pi$ type layer 12 is 1.0E14 per cubic centimeter.

Figure 3:
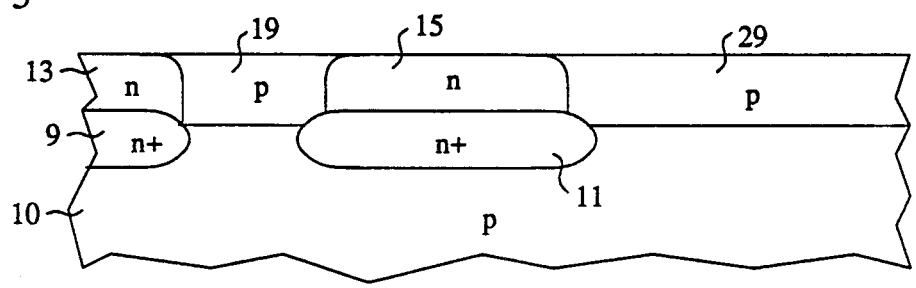

Next (FIG. 3), by known selective masking and impurity doping techniques, n tub regions 13 and 15, and p tub regions 19 and 29 are formed. Next, by means of a known technique of selective oxidation, or of selective etching of the silicon substrate and oxide fill, or of both, thick isolation oxides are formed. Then, a suitable donor impurity implant into a portion of the n tub 15, followed by a suitable thermal drive, converts such portion into an n+ type conductivity region ("collector plug") 55.

Figure 4:
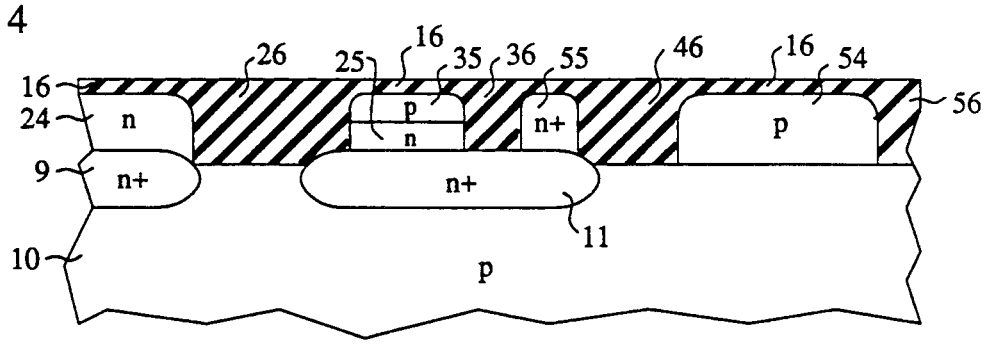

Then (FIG. 4) by known techniques, such as ion implantation, a p type region 35 is formed at the top of the n region 25, for serving as the base region of the bipolar npn transistor 300. Next, an oxidation of the entire top surface of the structure being fabricated is carried out to form a "gate" oxide layer 16 overlying MOS areas—e.g., overlying n tub region 24—and to complete a "base" oxide layer 16 overlying base areas—e.g., overlying p type region 35—of bipolar areas.

At this point in the process, the following semiconductor regions and oxide layers have been formed: a localized n tub region 24, stemming from the n tub region 13; relatively thick localized isolation (field) oxide layers 26, 36, 46, 56; n type regions 25 and 55, stemming from the n tub region 15; a localized p type tub region 54, stemming from the p tub region 29; and a relatively thin oxide layer 16, suitable for use as a gate oxide in an MOS transistor. The p region 19 disappears during the field oxide formation, except that portions (not shown) of p-type material, stemming from the original p region 19, can advantageously remain along the bottom boundary of the field oxide layer 26, for example, which prevents unwanted electrical shorting together of the n+ regions 9 and 11 during operation.

Figure 5:
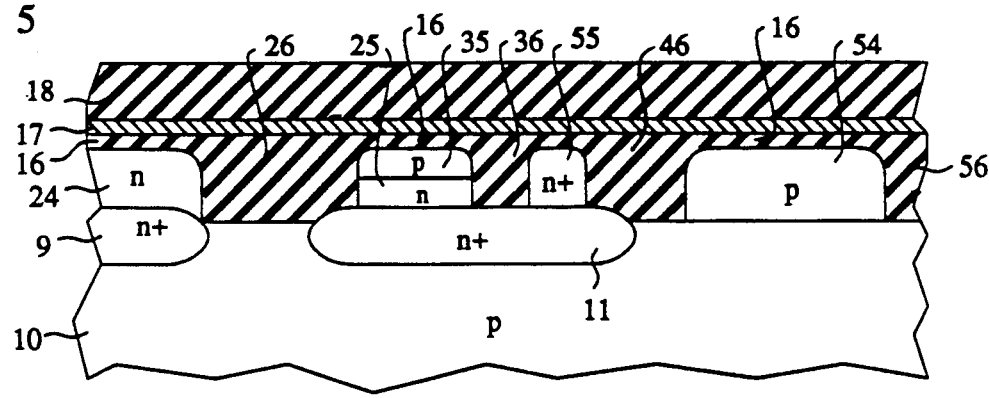

After the growth of the thin oxide layer 16, a relatively thin layer 17 of polysilicon (FIG. 5) and a relatively thick dielectric layer 18 of silicon dioxide, advantageously as deposited from a TEOS (tetra-ethyl-ortho-silicate) source, are deposited. Typically, the thickness of the polysilicon layer 17 is in the approximate range of 0.06 to 0.10 micrometer, whereas the thickness of the dielectric layer 18 is typically in the approximate range of 0.5 to 0.8 micrometer.

Alternatively, the dielectric layer 18 can be a low temperature deposited silicon oxide, nitride, or oxynitride, in which case the layer 17 can be either polysilicon or $\alpha$-amorphous silicon. By "low temperature" is meant the approximate range of room temperature to 500 degrees C.

Next (FIG. 6), by known masking and etching techniques, vertical apertures 21 and 23—i.e., with smooth parallel walls—are anistropically etched, reaching down through the dielectric layer 18 to the polysilicon layer 17. This polysilicon layer provides a desirable etch stop so that there is no damage to the substrate silicon, especially in the MOS areas. At the same time a vertical aperture (window) 22 is also anistropically etched. A separate mask is used to expose the aperture 22 in the bipolar area but not the apertures 21 and 23 in the MOS areas, and additional etching steps make the aperture 22 reach down through not only the dielectric layer 18 but also through the polysilicon layer 17 and the base oxide layer 16 to the p region 35. These additional etching steps thus remove polysilicon and oxide only in the bipolar areas and not in the MOS transistor areas, which are thus masked.

During the etching of the aperture 22 through the gate oxide layer 16, a ridge 32 slightly deeper than the base oxide thickness is formed at the top of this aperture, which is of little if any significance and will not be discussed further.

After the etching of apertures 21 and 23, a self-aligned ion implantation can be performed, if desired, to dope the silicon underlying these apertures for the purposes of control over MOS transistor threshold and punchthrough.

Figure 10:
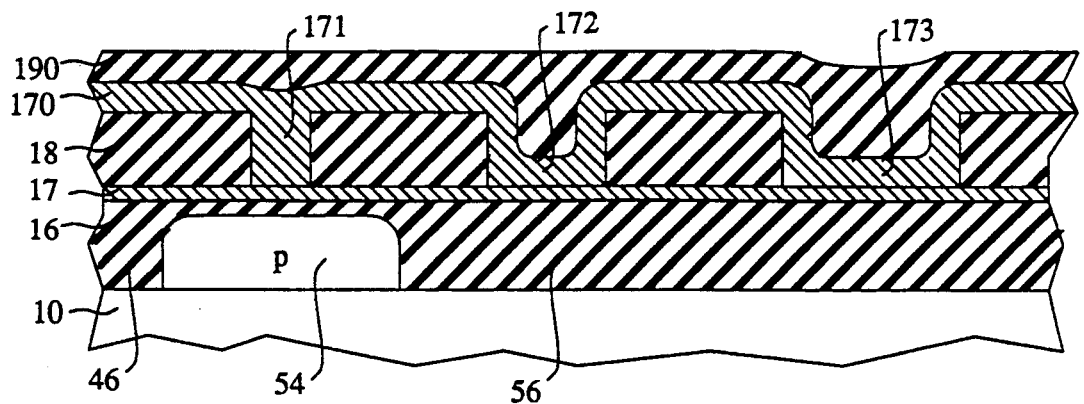
FIGS. 10-12 show further stages of fabrication intermediate those shown in FIGS. 6 and 7, in accordance with another specific embodiment of the invention.
Figure 11:
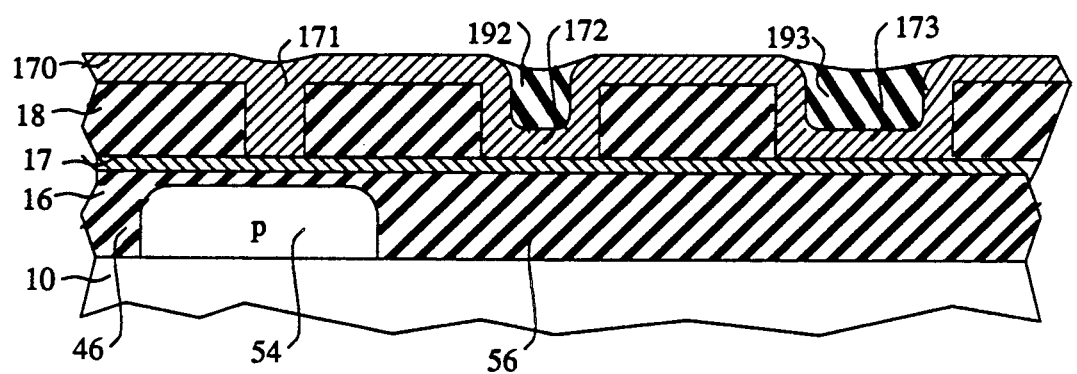
Figure 12:
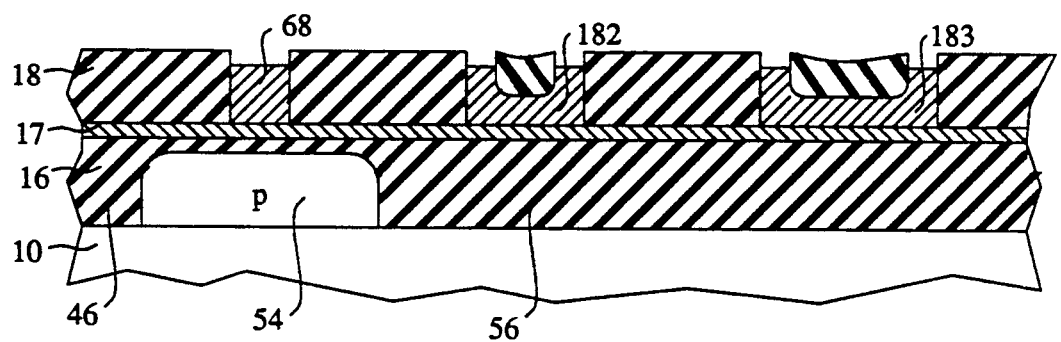

Next (FIG. 7), localized polysilicon electrode layers 64, 66, and 68 are deposited in the windows 21, 22, and 23, respectively, such as by selective chemical vapor deposition (CVD) of polysilicon, or preferably by uniform chemical vapor deposition of polysilicon followed by etching back at least to the top of the dielectric layer 18 as shown in greater detail in FIGS. 10–12. In case selective CVD of polysilicon is used, the apertures can be partially or completely filled (to the top) with polysilicon.

Figure 8:
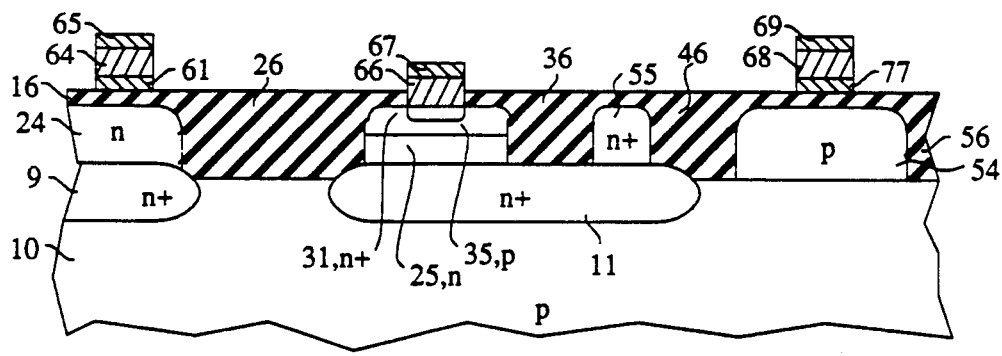

The localized polysilicon electrode layers 64, 66, and 68 are advantageously doped with impurities, to lower their electrical resistivities. Activation of dopants may take place later at the same time as the source diffusion, drain diffusion, and base contact region diffusion (FIG. 9). An outdiffusion from the polysilicon layer 66 creates the n+ region 31 which acts as the emitter of the npn bipolar transistor 300 (FIG. 8).

The polysilicon layers 64, 66, and 68 can then be capped with metal or metal silicide layers 65, 67 and 69, respectively. The metal layer can be, e.g., tungsten that has been selectively deposited. The metal silicide can be, for example, cobalt disilicide, tungsten silicide, or molybdenum silicide. A combination of a metal layer located on a metal silicide layer can also be used.

Then (FIG. 8), the dielectric layer 18 is removed, typically by wet etching with hydrofluoric acid in water. This etching is stopped by the top surface of the polysilicon layer 17. A high etch-rate oxide, or a high etch-rate ratio of the dielectric to the metal or metal silicide is preferred. Next, the polysilicon layer 17 is removed—except at areas underlying the polysilicon layers 64, 66, and 68 (i.e., at areas underlying the metal silicide layers 65, 67, and 69)—typically by reactive ion etching in which chlorine is the dominant etching species. This etching is stopped by the top surface of the gate oxide layer 16, whereby localized polysilicon (gate) electrode layers 61 and 77 remain underneath the localized polysilicon layers 64 and 68, respectively. Lightly doped source-and-drain implants may then be applied in a self-aligned manner to the n-channel and/or p-channel devices.

Next (FIG. 9), sidewall oxide layers 81, 91, and 101 are formed on the sides of the localized electrode layers 61, 64, 65—66, 67—and 77, 68, 69, respectively by means of chemical vapor deposition and reactive ion etching. Then, impurities suitable for the source and drain of an n-channel MOS transistor are implanted in the neighborhood of the gate oxide 76, followed (or preceded) by implanting impurities suitable for the source and drain of a p-channel MOS transistor in the neighborhood of the gate oxide 66. The same implant used for the p-channel source and drains may also be used for forming the p+ base contact regions 92 for the npn transistor.

A suitable anneal can then be performed to relocate the edges of the resulting source and drain regions 82, 83, 102, and 103 as desired. Next, electrode contacts, 84, 85, 86, 93, 104, and 105 can be formed by known procedures. Typically these electrodes are made of doped polysilicon or titanium nitride/titanium silicide.

The electrodes 84 and 85 and 65 (FIG. 9) can serve as the source and drain and gate contacts, respectively, of the p-channel transistor 200; the electrodes 67, 86, and 93 can serve as the emitter, base, and collector contacts, respectively, of the bipolar npn transistor 300; and the electrodes 104, 69, and 105 can serve as the source and drain and gate contacts, respectively, of the n-channel MOS transistor 400. Further interconnection metallization (not shown) can then be fabricated, to form BiCMOS integrated circuits.

Figure 6:
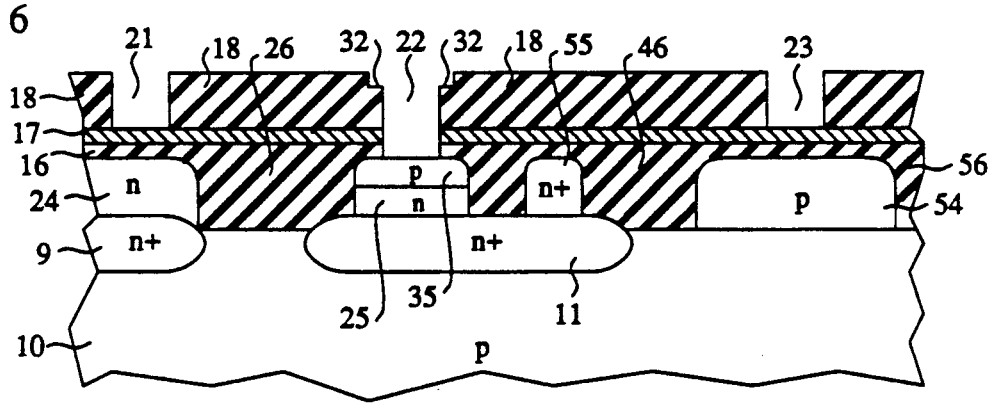
Figure 7:
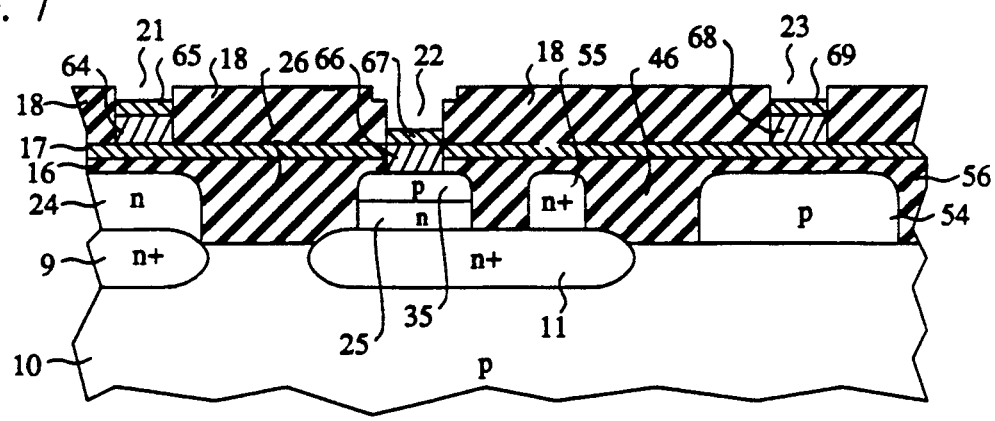

FIGS. 10-12 show in greater detail some further stages of fabrication, intermediate those shown in FIGS. 6 and 7, as well as over a different area of the top surface of the semiconductor body 10, in accordance with another specific embodiment of the invention. In particular, FIG. 12 shows polysilicon layers 68, 182, and 183 suitable for use as an MOS gate electrode, a conductive (metallization) line (runner), and a conductive (metallization) pad, respectively. Typically, the width of the (conductive pad) layer 183—that is, the width of the aperture in the dielectric layer 18 into which the (metallization pad) layer 183 is deposited—is equal to or less than approximately 50 to 75 microns.

As shown in FIG. 10, a polysilicon layer 170 is deposited all over the top of the structure shown in FIG. 6, followed by the coating of a resist layer 190. In particular, polysilicon portions 171, 172, 173 are deposited in the various apertures in the dielectric layer 18. Then (FIG. 11), the entire top surface of the resist layer 190 is subjected to an etching step which, preferably, does not attack the polysilicon layer 170 and which does not remove all the apertures overlying polysilicon portions 172 and 173 (which are wider than polysilicon portion 171) whereby resist portions 192 and 193 overlying the polysilicon portions 172 and 173, respectively, (but not overlying the polysilicon portion 171) remain in the structure being fabricated.

Next (FIG. 12), the polysilicon layer 170 is subjected to a selective etching which removes polysilicon completely from the top surfaces of the dielectric layer 18 but only partially from the apertures. After a final resist stripping (not shown), the remaining polysilicon layers 68, 182, and 183 can then be doped with impurities or can have been doped during the polysilicon deposition, in order to serve as gate electrode, conductive runner, and conductive pad, respectively.

It is to be expected that the side-walls of the polysilicon electrodes 64, 66, 68 as fabricated in this invention will be smooth and vertical, and hence their widths will be uniform, because the sidewalls of the apertures 21, 22, 23 in the dielectric layer 18 will be relatively smooth and vertical; and this smoothness and uniformity of the apertures have been confirmed by experiment to be superior to those of polysilicon electrodes fabricated by conventional resist and etching processes.

Although only a single bipolar, a single n-channel, and a single p-channel MOS transistor are shown in FIGS. 1-9, it should be understood that many such transistors can be formed simultaneously in the same semiconductor body in accordance with integrated circuit principles.

Although the invention has been described in detail with reference to specific embodiments, various modifications can be made without departing from the scope of the invention. For example, added implantations of impurities into appropriate regions located at the top surface of the body 10, for the purpose of forming channel stops for the MOS transistors, can be performed. Also, the various polysilicon electrode layers can be further doped with impurities, to adjust the electrical conductivities of these layers. Further, the field oxide layers 26, 36, 46, 56 need not be coplanar with the gate oxide layer 16. Finally, in addition to fabricating bipolar npn transistors in the n tubs, bipolar pnp transistors can be fabricated in the p tubs.

We claim:

1. A method of fabricating semiconductor integrated circuits including the steps of:
   (a) forming a first relatively thick and a relatively thin insulating layer upon respective first and second portions of a major surface of a semiconductor body;
   (b) forming a first horizontal polycrystalline silicon or amorphous silicon layer upon both the relatively thin and the first relatively thick insulating layer;
   (c) forming a second relatively thick insulating layer upon the first polycrystalline or amorphous silicon layer;
   (d) forming at least a first vertical aperture penetrating through the second relatively thick insulating layer but not through the first horizontal silicon layer;
   (e) forming a first vertical polysilicon layer located within the first vertical aperture contacting the first polycrystalline silicon or amorphous horizontal silicon layer;
   (f) removing the second relatively thick insulating layer; and
   (g) removing the first horizontal silicon layer except at regions defined by and underlying the first vertical aperture.

2. The method of claim 1 further including the steps of:
   (a) introducing first conductivity type impurities into the portion of the top surface of the body underlying the first vertical aperture prior to forming the horizontal silicon layer;

(b) forming a sidewall insulating layer on the sidewall of the vertical polysilicon layer; and (c) introducing second conductivity type impurities, opposite the first type, into a portion of the top surface of the body contiguous with the sidewall insulating layer.

3. The method of claim 1 further including, prior to step (g), the step of forming a layer of metal or metal silicide within the first vertical aperture on the top surface of the said first vertical polysilicon layer.

4. The method of claim 1 in which the second insulating layer is silicon dioxide deposited from a TEOS source.

5. The method of claim 1 in which the second insulating layer is formed by depositing silicon dioxide at a temperature in the approximate range of room temperature to 500 degrees C.

6. The method of claim 1 in which the second insulating layer comprises silicon nitride.

7. The method of claim 1 in which the step of depositing the polysilicon layer within the vertical aperture is performed by chemical vapor deposition.

8. The method of claim 1 in which the step of removing is performed by wet etching.

9. The method of claim 1 in which during step (d), simultaneously with the forming of the first vertical aperture, at least a second vertical aperture is formed initially penetrating through the second relatively thick insulating layer but not through the silicon layer, the second but not the first aperture subsequently being subjected to an etching which causes the second but not the first aperture to penetrate down through the silicon layer and through the relatively thin insulating layer, and during step (e), simultaneously with the depositing of the first vertical polysilicon layer, a second vertical polysilicon layer is deposited within the second vertical aperture.

10. The method of claim 9 further including, prior to step (g), the step of simultaneously forming first and second layers of metal or metal silicide within the first and second vertical apertures, respectively, on the top surfaces of the first and second vertical polysilicon layers, respectively.

11. The method of claim 9 further including the steps of:

(a) introducing first conductivity type impurities into the portion of the top surface of the body underlying the first vertical aperture prior to forming the horizontal silicon layer;

(b) introducing second conductivity type impurities into the portion of the top surface of the body underlying the second vertical aperture prior to forming the horizontal silicon layer.

12. The method of claim 1 in which step (e) is performed by selective epitaxial deposition.

13. A method of fabricating semiconductor integrated circuits including the steps of:

(a) forming a first relatively thick and a relatively thin insulating layer upon respective first and second portions of a major surface of a semiconductor body;

(b) forming a first polycrystalline horizontal silicon or an amorphous horizontal silicon layer upon both the relatively thin and the first relatively thick insulating layer;

(c) forming a second relatively thick insulating layer upon the first polycrystalline or amorphous silicon layer;

(d) forming a vertical aperture penetrating through the second relatively thick insulating layer, the silicon layer, and the relatively thin insulating layer;

(e) depositing a vertical polysilicon layer within the vertical aperture contacting the first horizontal silicon layer;

(f) removing the second relatively thick insulating layer; and (g) removing the horizontal silicon layer except at regions defined by and underlying the vertical aperture.

14. The method of claim 13 further including the steps of:

(a) introducing first conductivity type impurities into the portion of the top surface of the body underlying the aperture prior to forming the vertical polysilicon layer;

(b) forming a sidewall insulating layer on the sidewall of the vertical polysilicon layer; and (c) introducing second conducivity type impurities, opposite the first type, into a portion of the top surface of the body contiguous with the sidewall insulating layer.

15. The method of claim 13 further including the step of forming a layer of metal or metal silicide within the vertical aperture on the top surface of the vertical polysilicon layer.

16. The method of claim 13 further including the step, prior to step (g), of forming a layer of metal or metal silicide within the vertical aperture on the top surface of the vertical polysilicon layer.

* * * * *

UNITED STATES PATENT AND TRADEMARK OFFICE
CERTIFICATE OF CORRECTION

PATENT NO. : 5,057,455
DATED : October 15, 1991
INVENTOR(S) : P-D Foo, W. T. Lynch, C-S Pai It is certified that error appears in the above-identified patent and that said Letters Patent is hereby corrected as shown below:

Title page,  Abstract, lines 1-2, "in the BiCMOS" should read
--in a BiCMOS--.
Abstract, line 5, "tin" should read --thin--.

Signed and Sealed this

Twenty-third Day of February, 1993

Attest:

STEPHEN G. KUNIN

*Attesting Officer*    Acting Commissioner of Patents and Trademarks